United States Patent
Galler

(10) Patent No.: US 10,505,099 B2
(45) Date of Patent: Dec. 10, 2019

(54) MULTI-LAYER COMPONENT AND METHOD FOR PRODUCING A MULTI-LAYER COMPONENT

(71) Applicant: Epcos AG, München (DE)

(72) Inventor: Martin Galler, Kalsdorf (AT)

(73) Assignee: Epcos AG, München (DE)

( * ) Notice: Subject to any disclaimer, the term of this patent is extended or adjusted under 35 U.S.C. 154(b) by 401 days.

(21) Appl. No.: 15/024,758

(22) PCT Filed: Sep. 11, 2014

(86) PCT No.: PCT/EP2014/069420
§ 371 (c)(1),
(2) Date: Mar. 24, 2016

(87) PCT Pub. No.: WO2015/055359
PCT Pub. Date: Apr. 23, 2015

(65) Prior Publication Data
US 2016/0218270 A1 Jul. 28, 2016

(30) Foreign Application Priority Data
Oct. 17, 2013 (DE) .................. 10 2013 017 350

(51) Int. Cl.
*H01L 41/047* (2006.01)
*H01L 41/083* (2006.01)
(Continued)

(52) U.S. Cl.
CPC ......... *H01L 41/0471* (2013.01); *H01G 4/008* (2013.01); *H01G 4/12* (2013.01);
(Continued)

(58) Field of Classification Search
CPC ... H01L 41/0471; H01L 41/083; H01L 41/09; H01L 41/27; H01L 41/297; H01G 4/008; H01G 4/12; H01G 4/30
See application file for complete search history.

(56) References Cited

U.S. PATENT DOCUMENTS

| 5,144,527 A | 9/1992 | Amano |
| 5,735,027 A | 4/1998 | Hageman |
(Continued)

FOREIGN PATENT DOCUMENTS

| DE | 19542365 A1 | 5/1997 |
| DE | 4091418 C2 | 7/2001 |
(Continued)

OTHER PUBLICATIONS

Written Opinion of the International Searching Authority, dated Apr. 28, 2016 (7 pages).

*Primary Examiner* — Bryan P Gordon
(74) *Attorney, Agent, or Firm* — Nixon Peabody LLP

(57) ABSTRACT

A multi-layer component having a main body including a stack of alternately arranged dielectric layers and internal electrode layers. In an insulation region on the outer sides of the main body a length of a connecting line between adjacent internal electrode layers of unlike polarity is greater than a direct distance between the adjacent electrode layers. A method for producing a multi-layer component is also provided. The method includes providing a main body including a stack of alternately arranged dielectric layers and internal electrode layers. The method also includes extending the connecting line between adjacent internal electrode layers of unlike polarity on the outer sides of the main body.

12 Claims, 2 Drawing Sheets

(51) Int. Cl.
*H01L 41/297* (2013.01)
*H01G 4/008* (2006.01)
*H01G 4/12* (2006.01)
*H01G 4/30* (2006.01)
*H01L 41/09* (2006.01)
*H01L 41/27* (2013.01)

(52) U.S. Cl.
CPC ............ *H01G 4/30* (2013.01); *H01L 41/083* (2013.01); *H01L 41/09* (2013.01); *H01L 41/27* (2013.01); *H01L 41/297* (2013.01)

(56) References Cited

U.S. PATENT DOCUMENTS

| | | | |
|---|---|---|---|
| 6,232,701 B1 | 5/2001 | Schuh | |
| 7,225,514 B2 | 6/2007 | Iwase | |
| 9,062,726 B2 | 6/2015 | Nishii | |
| 9,153,766 B2 | 10/2015 | Nakamura | |
| 2001/0055192 A1* | 12/2001 | Nakano | H01G 4/0085 |
| | | | 361/306.3 |
| 2004/0255443 A1 | 12/2004 | Iwase | |
| 2006/0221547 A1* | 10/2006 | Miura | H01G 4/008 |
| | | | 361/305 |
| 2007/0176521 A1 | 8/2007 | Nakamura | |
| 2008/0169530 A1* | 7/2008 | Koebrugge | C04B 35/4682 |
| | | | 257/532 |
| 2009/0320255 A1 | 12/2009 | Ganster et al. | |
| 2013/0062578 A1* | 3/2013 | Park | C04B 35/462 |
| | | | 252/512 |
| 2014/0065308 A1* | 3/2014 | Park | C04B 35/462 |
| | | | 427/314 |
| 2015/0042212 A1* | 2/2015 | Somitsch | H01L 41/0471 |
| | | | 310/364 |
| 2015/0325781 A1 | 11/2015 | Rinner | |

FOREIGN PATENT DOCUMENTS

| | | | | |
|---|---|---|---|---|
| DE | 19860001 C2 | 10/2001 | | |
| DE | 102004026572 A1 | 1/2005 | | |
| DE | 102006001656 A1 | 2/2007 | | |
| DE | 102007004813 A1 | 8/2008 | | |
| DE | 102012101351 A1 | 8/2013 | | |
| DE | 102012105287 A1 | 12/2013 | | |
| EP | 2461385 A1 * | 6/2012 | ......... | F02M 51/0603 |
| JP | H 05-267743 A | 10/1993 | | |
| JP | H07106654 A | 4/1995 | | |

* cited by examiner

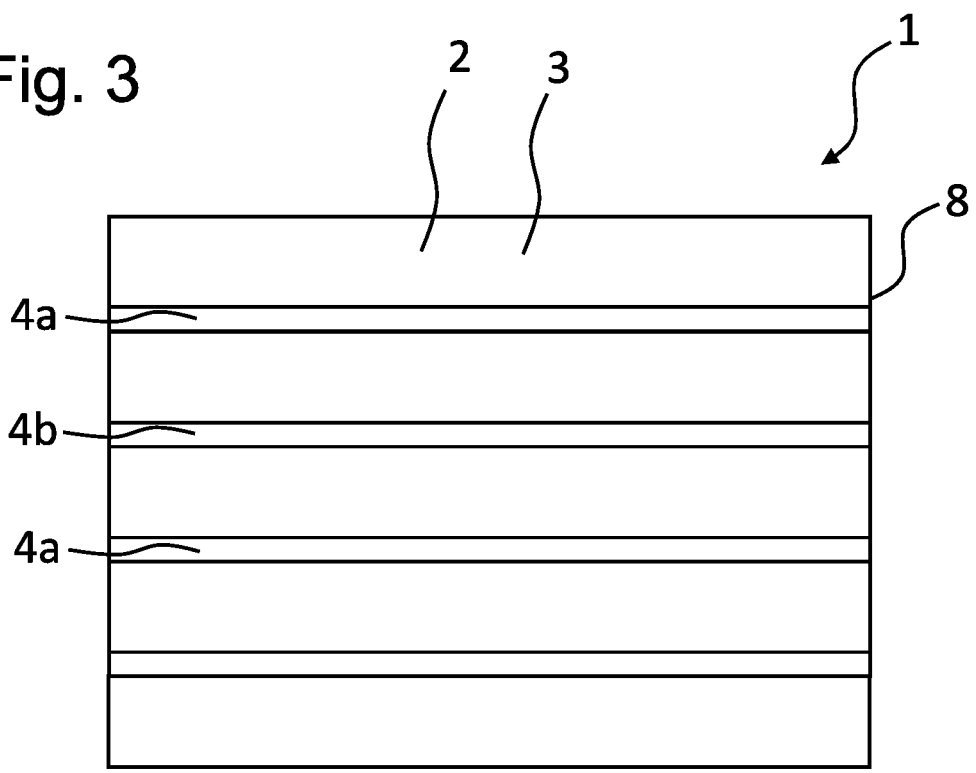
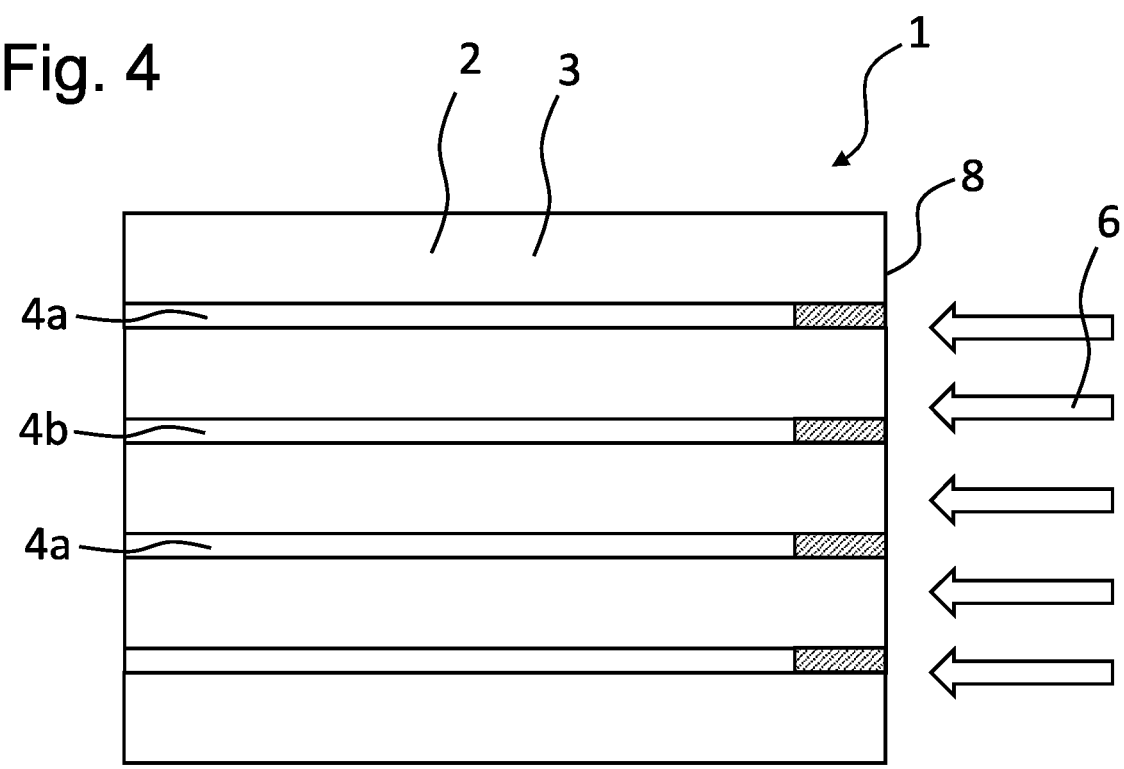

MULTI-LAYER COMPONENT AND METHOD FOR PRODUCING A MULTI-LAYER COMPONENT

CROSS-REFERENCE TO RELATED APPLICATIONS

This application is a U.S. National Stage of International Application No. PCT/EP2014/069420, filed on Sep. 11, 2014, which claims the benefit of Germany Patent Application No. 102013017350.7, filed on Oct. 17, 2013, both of which are incorporated herein by reference in their entireties.

A multi-layer component and a method for producing a multi-layer component are provided. For example, the multi-layer component is a piezo actuator, which can be used for actuating an injection valve in a motor vehicle. Alternatively, the multi-layer component may be a multi-layer capacitor.

One object of the invention is to provide a reliable multi-layer component. Another object of the invention is to provide a multi-layer component with which flashovers on the outer sides of the multi-layer component are prevented.

A multi-layer component with a main body comprising a stack of alternately arranged dielectric layers and internal electrode layers is provided. In an insulation region on the outer sides of the main body, a length of a connecting line between adjacent internal electrode layers of unlike polarity is greater than a direct distance between the adjacent electrode layers. In particular, in the insulation region no internal electrode layer extends as far as an outer side of the main body.

The insulation region is a region in which the outer sides of the main body are not covered. In particular, in the insulation region there is no outer contacting applied to the main body. The length of the connecting line between adjacent internal electrode layers of unlike polarity is also referred to as the effective distance. The connecting line between the adjacent internal electrode layers of unlike polarity runs first from one end of an internal electrode layer over the shortest possible path to an outer side of the main body, along the underside and then once again over the shortest possible path to the end of an adjacent internal electrode layer of unlike polarity. The effective distance is consequently the length of the shortest possible path between the electrode layers that does not lead through the dielectric material of the dielectric layers between the electrode layers.

The direct distance corresponds to the shortest possible path between two adjacent internal electrode layers of unlike polarity. This path may lead through the dielectric material of the dielectric layers.

A multi-layer component in which the length of the connecting line between adjacent internal electrode layers of unlike polarity on the outer side of the main body is greater than a direct distance between the adjacent electrode layers has the advantage that no additional passivation, for example with an elastic polymer or a ceramic, is necessary. As a result, the lifetime of the multi-layer component is not limited by aging of the passivation or an overload of the passivation. In particular, there is no risk of passivation failure being caused by local overextension or overheating.

Furthermore, a performance of the multi-layer component is improved. This is because no clamping effect of a ceramic passivation impairs the function of the multi-layer component. Furthermore, the elimination of the passivation means that the space requirement of the multi-layer component is less. Moreover, a higher geometrical accuracy can be achieved. This advantage is obtained for example because the electrodes are subsequently removed or transformed and a ceramic passivation does not have to be applied already before the sintering.

In the case of a multi-layer component as described above, an electrical field strength at a surface of the multi-layer component is reduced. The electrical field strength E is calculated on the basis of the formula $E=U/d$, where U is an applied voltage and d is the length of the connecting line between adjacent internal electrode layers of unlike polarity.

According to one embodiment, the dielectric layers reach as far as an outer side of the main body over their entire thickness. In this case, the thickness of the dielectric layers gives the extent of the respective layer in the stacking direction. Accordingly, each of the dielectric layers reaches from an upper edge, which directly adjoins one electrode layer, to a lower edge, which directly adjoins the next electrode layer, as far as the outer side of the main body.

According to one embodiment, in the insulation region the internal electrode layers do not reach as far as an outer side of the main body. In particular, in the insulation region air gaps are arranged between the outer sides of the main body and the ends of the internal electrode layers.

In a further embodiment, in the insulation region a dielectric is arranged between the internal electrode layers and the outer sides of the main body. The dielectric may for example be a metal salt. The dielectric is preferably created during the production of the multi-layer component by transformation of the internal electrode layers.

The dielectric layers and the internal electrode layers arranged in between are preferably stacked along a stacking direction. The stacking direction preferably corresponds to the longitudinal direction of the main body. The dielectric layers and the internal electrode layers are preferably stacked alternately one on top of the other.

The internal electrode layers preferably contain copper or consist of copper. Alternatively, the internal electrode layers contain silver-palladium or consist of silver-palladium.

The dielectric layers may comprise a piezoelectric material. For example, the dielectric layers may comprise a ceramic material, in particular a piezoceramic material. For producing the main body, green sheets to which for example a metal paste is applied for the forming of internal electrode layers may be used. For example, the metal paste is applied in a screen printing process. The metal paste may contain copper. Alternatively, the metal paste may contain silver or silver-palladium. After the application of the metal paste, the sheets are preferably stacked, pressed and sintered together, so that a monolithic sintered body is created. The main body of the components is preferably formed by a monolithic sintered body, for example by a sintered body produced as described above.

For example, the multi-layer component is formed as a piezoelectric component, for example as a piezo actuator. In the case of a piezo actuator, when a voltage is applied to the internal electrode layers, piezoelectric layers arranged between the internal electrode layers expand, so that a stroke of the piezo actuator is produced. The multi-layer component may also be formed as some other component, for example as a multi-layer capacitor.

The multi-layer component has on the outer sides of the main body a contacting region, which is intended for applying outer contacting layers. In the contacting region, at least every second internal electrode layer extends as far as the outer side of the main body.

The outer contacting preferably serves for applying a voltage between internal electrode layers that are adjacent in the stacking direction. In particular, the outer contacting serves for feeding current to the internal electrode layers. For example, two outer electrodes are arranged on opposite outer sides of the main body.

The internal electrode layers are preferably electrically connected to one of the outer electrodes and electrically insulated from the other outer electrode alternately in the stacking direction.

According to one embodiment, in the insulation region the internal electrode layers are at a distance of 250 μm to 400 μm from the outer sides of the main body. In the insulation region, the internal electrode layers are preferably at a distance of 350 μm from the outer sides of the main body.

In the insulation region, the internal electrode layers may have an etched surface.

A method for producing a multi-layer component is also provided. The method comprises, in a first step, the provision of a main body comprising a stack of alternately arranged dielectric layers and internal electrode layers. In a further step, the method comprises the extension of the connecting line between adjacent internal electrode layers of unlike polarity on the outer sides of the main body.

According to one embodiment, the connecting line between adjacent internal electrode layers of unlike polarity on the outer sides of the main body is extended by electrode material being removed. Alternatively, on the outer sides of the main body electrode material is transformed into a dielectric. For example, electrode material is transformed into a metal salt.

The removal or transformation is preferably performed by means of immersion in an acid or by means of conversion in an oxidizing or nitriding environment.

According to one embodiment, a mask is applied before the removal or the conversion of the electrode material in the contacting region of the main body that is intended for applying an outer contacting. The mask prevents removal of the electrode material in the contacting region. This allows reliable contacting of the internal electrode layers after the application of an outer contacting.

In a further embodiment, an outer contacting is applied to the outer sides of the main body before the removal or the conversion of the electrode material. The outer contacting is covered by a mask during the removal or the transformation of the electrode material.

The invention is explained below on the basis of schematic figures.

FIG. 3 shows a longitudinal section through a multi-layer component before a chemical treatment, FIG. 4 shows a longitudinal section through a multi-layer component during or after a chemical treatment.

Figure 1:
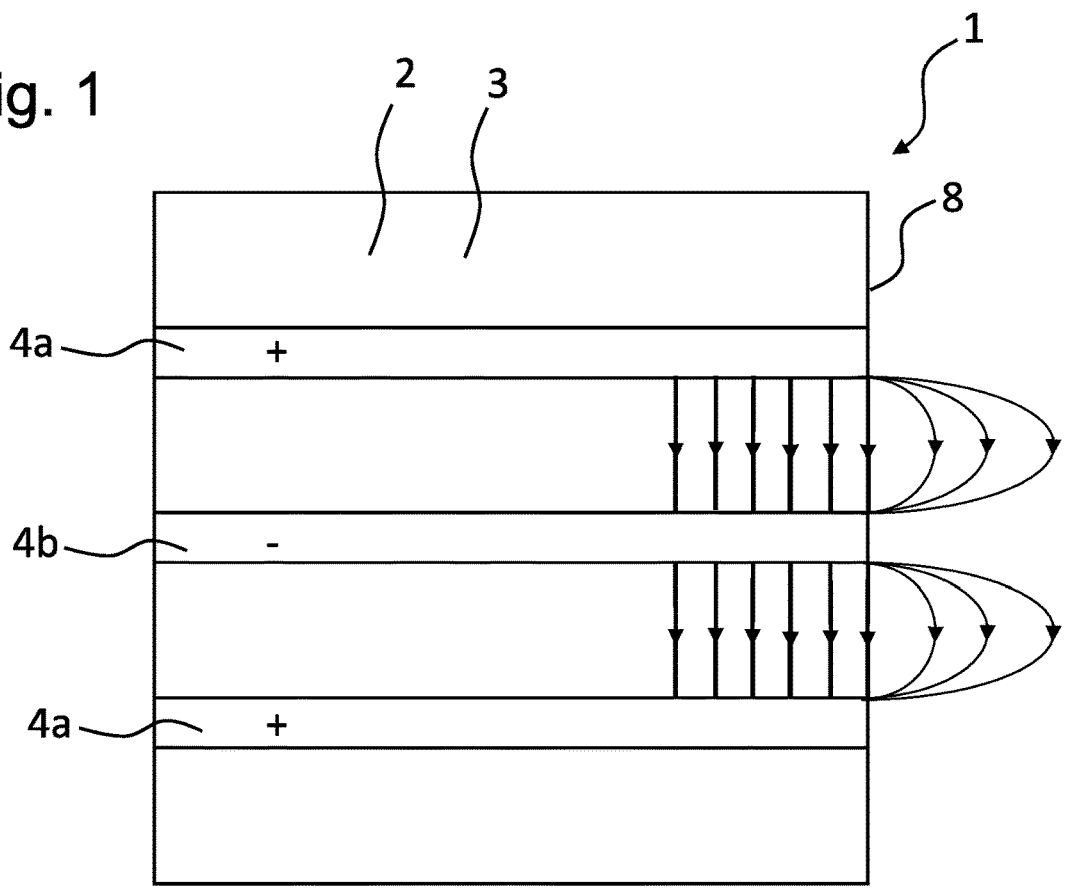
FIG. 1 shows a longitudinal section through a multi-layer component.

FIG. 1 shows a longitudinal section through a multi-layer component 1. The multi-layer component 1 has a main body 2. The main body 2 comprises a stack of alternately arranged dielectric layers 3 and internal electrode layers 4a, 4b. The dielectric layers comprise a piezoelectric material. The internal electrode layers 4a, 4b are connected alternately to a first outer contacting and a second outer contacting (not represented). The first outer contacting and the second outer contacting have in each case a different polarity. In particular, first internal electrode layers 4a are connected to an outer contacting of a first polarity, and internal electrode layers 4b are connected to an outer contacting of a second polarity.

In the case of an electrical contacting of the multi-layer component 1 according to FIG. 1, when there are high electrical field strengths, for example of 2 kV/mm, electrical flashovers occur on the outer sides of the main body 2 between internal electrode layers 4a, 4b of different polarity.

Such flashovers are to be prevented in the multi-layer component according to the invention.

Figure 2:
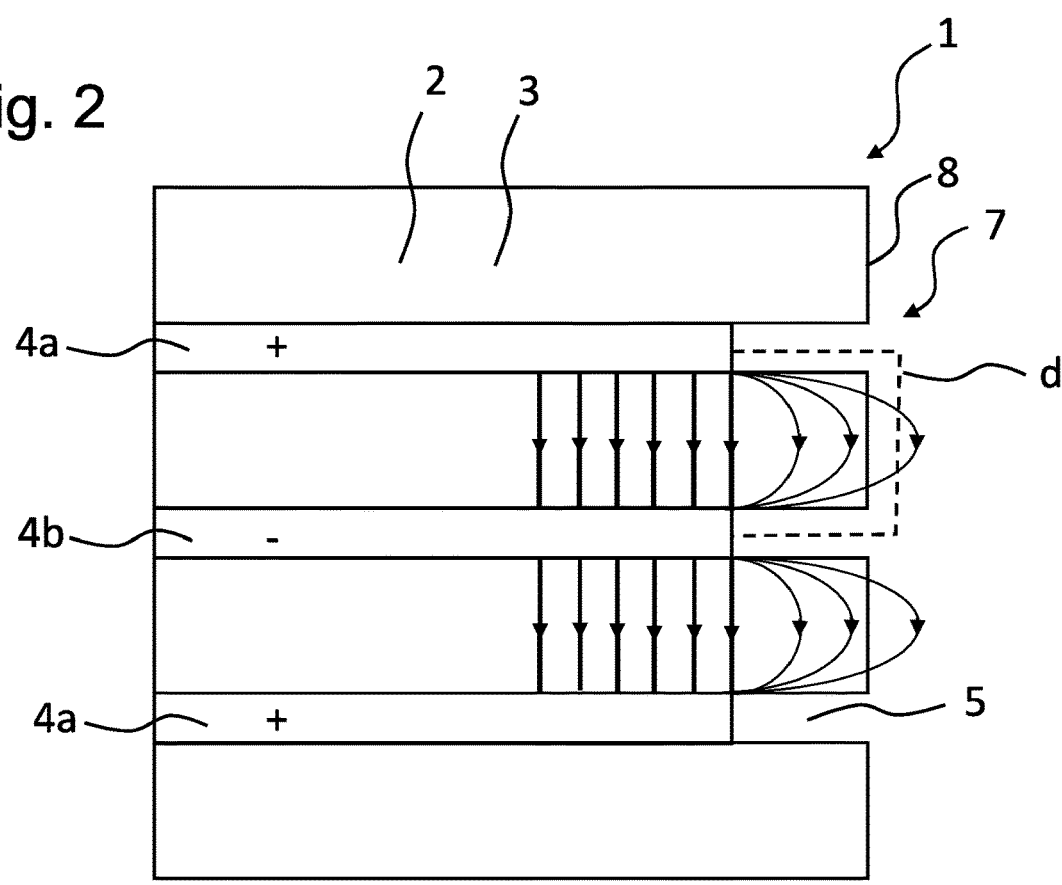
FIG. 2 shows a longitudinal section through a multi-layer component with removed internal electrode layers.

FIG. 2 shows a multi-layer component 1 in a sectional representation. In the multi-layer component according to FIG. 2, in an insulation region 7 on an outer side 8 of the main body 2 the first and second internal electrode layers 4a, 4b have been removed. In particular, the internal electrode layers 4a, 4b do not reach as far as an outer side 8 of the main body 2. In place of the internal electrode layers 4a, 4b there is an air gap 5. As a result, the electrical field strength on the outer side 8 of the main body 2 is lowered to the extent that flashovers no longer occur. In a further embodiment, the air gap may be at least partially filled with a nonconductive material.

The electrical field strength on the outer side 8 of the main body 2 can be lowered by increasing an effective distance d between adjacent internal electrode layers 4a, 4b while the voltage remains the same. As a result, there is a reduction in the electrical field strength, which is calculated by the formula $E=U/d$. The effective distance d is the length of the shortest possible path between the electrode layers 4a, 4b that does not lead through the dielectric material of the dielectric layers 3 between the electrode layers. In principle, the path with the effective distance d consequently leads along an outer side 8 of the main body. In FIG. 2, the path with the effective distance d is depicted as a dashed line. The effective distance d is also referred to as the effective layer thickness.

In FIG. 2, the internal electrodes 4a, 4b are represented as only removed on one outer side. However, in a possible multi-layer component, the internal electrodes are removed on the entire exposed outer surface area. The exposed outer surface area is the surface area that is formed by the side areas of the main body and is not covered by an outer contacting. This surface area is also referred to as the insulation region 7.

Furthermore, the dielectric layers 3 reach as far as the outer side 8 of the main body 2 over their entire thickness.

In FIGS. 3 and 4, a method for producing a multi-layer component 1 is illustrated.

FIG. 3 shows a main body 2 of a multi-layer component 1 before a chemical treatment. A chemical treatment may comprise a removal or transformation of the internal electrode layers 4a, 4b. Before the chemical treatment, the internal electrode layers 4a, 4b extend as far as the outer side of the main body.

FIG. 4 shows the main body 2 during or after a chemical treatment. The chemical treatment is performed for example by means of an acid. For this purpose, the main body is immersed in a bath with a chemical substance, for example an acid. The internal electrode layers 4a, 4b are thereby attacked by the chemical substance and dissolved until a required effective distance d between the internal electrode layers 4a, 4b has been reached. Alternatively, the chemical treatment is performed in an oxidizing or nitriding environment. The hatched region in FIG. 4 identifies the region in which the internal electrode layers react with the chemical substance. The arrows 6 are intended to represent the action of the chemical substance.

The distance of the internal electrode layers 4a, 4b from the outer side of the main body 2 after the chemical treatment is for example between 290 μm and 390 μm, e.g. 340 μm.

In a further embodiment, the internal electrode layers 4a, 4b are transformed by the chemical substance into a non-conductive material. For example, the internal electrode layers 4a, 4b are transformed into a metal salt.

The chemical substance is for example made up of 71% $H_2O$, 18% $HNO_{3(65\%)}$ and 11% acetic acid$_{(99\%-100\%)}$. The main body is for example immersed in the chemical substance for 4 h.

A contacting region on the outer sides of the main body 2, which is intended for applying an outer contacting, is covered over with a mask before the immersion in the chemical substance. If the outer contacting has already been applied to the outer sides of the main body before the chemical treatment, the outer contacting is covered over by a mask and thus protected from any influence of the chemical substance.

DESIGNATIONS 1 multi-layer component
2 main body
3 dielectric layer
4a internal electrode layer
4b internal electrode layer
5 air gap
6 arrows
7 insulation region
8 outer side
d effective distance

The invention claimed is:

1. A multi-layer component, having a main body comprising a stack of alternately arranged dielectric layers and internal electrode layers, wherein in an insulation region on the outer sides of the main body a length of a connecting line between adjacent internal electrode layers of unlike polarity is greater than a direct distance between the adjacent electrode layers, where in the insulation region a metal salt is arranged between the internal electrode layers and the outer sides of the main body, wherein the metal salt is arranged only in the insulation region between the internal electrode layers and the outer sides of the main body, and wherein the dielectric layers are free of the metal salt.

2. The multi-layer component according to claim 1, wherein in the insulation region the internal electrode layers do not reach as far as an outer side of the main body.

3. The multi-layer component according to claim 1, wherein air gaps are arranged between the ends of the internal electrode layers and the outer sides of the main body.

4. The multi-layer component according to claim 1, wherein in the insulation region a dielectric is arranged between the internal electrode layers and the outer sides of the main body.

5. The multi-layer component according to claim 1, wherein in a contacting region on the outer sides of the main body that is intended for applying outer contacting layers at least every second internal electrode layer extends as far as the outer side of the main body.

6. The multi-layer component according to claim 1, wherein in the insulation region the internal electrode layers are at a distance of 250 μm to 400 μm from an outer side of the main body.

7. The multi-layer component according to claim 1, wherein in the insulation region the internal electrode layers have an etched surface.

8. The Multi-layer component according to claim 1, wherein the insulation region is a region in which the outer sides of the main body are not covered.

9. The Multi-layer component according to claim 1, wherein in the insulation region no outer contacting is applied to the main body.

10. The multi-layer component according to claim 2, wherein air gaps are arranged between the ends of the internal electrode layers and the outer sides of the main body.

11. The multi-layer component according to claim 4, wherein in a contacting region on the outer sides of the main body that is intended for applying outer contacting layers at least every second internal electrode layer extends as far as the outer side of the main body.

12. The multi-layer component according to claim 2, wherein in the insulation region the internal electrode layers have an etched surface.

* * * * *